United States Patent
Fujiwara

(10) Patent No.: US 6,259,267 B1
(45) Date of Patent: Jul. 10, 2001

(54) POWER-CURRENT MEASURING CIRCUIT IN BURN-IN TESTER

(75) Inventor: Noritada Fujiwara, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/507,881

(22) Filed: Feb. 22, 2000

(30) Foreign Application Priority Data

Feb. 22, 1999 (JP) .................................................. 11-043794

(51) Int. Cl.[7] ........................... G01R 31/26; G01R 31/02; H01R 21/66
(52) U.S. Cl. ............................. 324/765; 324/763; 438/14; 438/17; 438/18
(58) Field of Search ..................................... 324/537, 765, 324/763; 438/14, 17, 18

(56) References Cited

U.S. PATENT DOCUMENTS

| | | | |
|---|---|---|---|
| 5,406,212 | * | 4/1995 | Hashinaga et al. .................. 324/760 |
| 5,414,370 | * | 5/1995 | Hashinaga et al. .................. 324/760 |
| 5,568,054 | * | 10/1996 | Iino et al. ............................. 324/760 |
| 5,949,242 | * | 9/1999 | Wood et al. .......................... 324/760 |
| 6,175,244 | * | 1/2001 | Gattiker et al. ....................... 324/765 |

* cited by examiner

Primary Examiner—Glenn W. Brown
Assistant Examiner—Wasseem Hamdan
(74) Attorney, Agent, or Firm—Fish & Richardson P.C.

(57) ABSTRACT

A power-current measuring circuit 200 is structured such that two types of power supply circuits are selectively turned on in accordance with the number of chips which are formed on a wafer 60 and which must be measured. A power-current measuring circuit and a power-current detection device corresponding to the output are provided so that resolution accuracy required to perform measurement of the power current is maintained. A current-measuring-circuit selection circuit 56 enables outputs of the two types of the current measuring circuits to selectively be input to one conversion circuit. Therefore, a necessity for connecting the conversion circuit and its peripheral circuits to each of the current measuring circuit can be eliminated. As a result, the size of the circuit can be reduced.

5 Claims, 2 Drawing Sheets

US 6,259,267 B1

POWER-CURRENT MEASURING CIRCUIT IN BURN-IN TESTER

BACKGROUND OF THE INVENTION

1. Field of the Invention

The present invention relates to a power-current measuring circuit for a burn-in tester, and more particularly to a power-current measuring circuit capable of satisfactorily measuring a power current which flows in each semiconductor integrated circuit formed on a wafer disposed in a burn-in tester which performs a burn-in test of the wafer on which the semiconductor integrated circuits have been formed and a power-current measuring method therefor.

2. Description of the Related Art

A process for manufacturing a semiconductor integrated circuit has been performed to maintain the reliability of products by applying power supply voltage to a plurality of semiconductor integrated circuit chips formed on a wafer disposed in a furnace of a constant temperature bath at a wafer level. Moreover, a test pattern signal corresponding to the type of the semiconductor integrated circuit chip is supplied to verify the operation (pass/fail) in a predetermined temperature environment. A burn-in test is performed as described above. The apparatus having a function of determining the pass/fail at the wafer level is referred to as a wafer-level burn-in tester.

The wafer-level burn-in tester incorporates a constant temperature bath with which temperatures and electric signals can be programmed. A multiplicity of test burn-in board (hereinafter called a "TBIB") on which the wafers are placed are loaded into the constant temperature bath. The TBIB in the constant temperature bath and an external tester are connected to each other through connectors provided for the constant temperature bath. A variety of test signals are transmitted/received through the connectors so that a burn-in test corresponding to the type of the chips placed on the TBIB is performed.

The burn-in test at the wafer level is performed such that measurement of a power current which flows in each semiconductor integrated circuit formed on the wafer is required to perform measurement of the power current for each chip and collective measurement of all of the chips or a plurality of the chips.

FIG. 2 shows an example of a power-current measuring circuit 100 for a conventional wafer level burn-in test. When the power-current measuring circuit 100 shown in FIG. 2 measures the power current of each chip on the wafer 20 mounted on the TBIB 19, the output of the power supply circuit 10 (in the foregoing case, a power supply circuit 10 incorporates only large-current measuring power supply circuit 10a having a large capacity with which all chips on the wafer 20 can be operated) is connected to each chip on the wafer 20 through a current-detecting resistor 11 and a wafer-chip selection circuit 15. A wafer-chip selection circuit 15 is connected to a control unit 22 through a bus (BUS). A chip on the wafer 20 instructed with a wafer-chip selection signal supplied from the control unit 22 is selected by wafer-chip selection switches 15a to 15n accommodated in the wafer-chip selection circuit 15. Thus, the power current output from the power supply circuit 10 is supplied to the selected chip.

The output of the power supply circuit 10 is as well as connected to a current measuring circuit 13 to which two ends and an input stage of the current-detecting resistor 11 are connected. The current measuring circuit 13 detects the differential voltage generated at the two ends of the current-detecting resistor 11 in accordance with the power current value communicated from the power supply circuit 10. The current measuring circuit 13 outputs a measured-current signal corresponding to the differential voltage to an A/D converter 18 through an AMP 17. The A/D converter 18 converts the measured-current signal input from the current measuring circuit 13 and formed into an analog fashion into a digital fashion and outputs a predetermined digital signal indicating the measured current value to the control unit 22 through the bus. Thus, the power current value can be measured.

The above-mentioned measurement of the power current at the wafer level is required to be capable of performing both of the power-current measuring test of all of the chips on the wafer 20 and the power-current measuring test of only one chip. The capacity of the power current which flows in the one chip on the wafer 20 and that of the power currents which flow in all of the chips are different from each other by several hundred times or greater. Therefore, it is preferable that the capacity of the power current of the power supply circuit 10 can precisely be set to be a wide range.

The conventional power-current measuring circuit 100 shown in FIG. 2, however, incorporates only the large-current measuring power supply circuit 10a having a large capacity with which all chips on the wafer 20 can be operated to serve as the power supply circuit 10. Therefore, the power currents which are required of both of the power-current measuring test of all chips on the wafer 20 and the power-current measuring test of only one chip and which are different from each other by several hundred times or greater cannot precisely be set. As a result, there arises a problem in that a required resolution accuracy for measuring the power current cannot be realized.

When the measurement resolution of the power-current measuring circuit 100 is adjusted to be capable of measuring the small power current of one chip on the wafer 20, an A/D converter having an excessively large number of bits and a current detection resistor corresponding to the large electric power is required. The foregoing specifications cannot be realized from a viewpoint of cost reduction.

Therefore, the structure of the conventional power-current measuring circuit 100 for the wafer-level burn-in tester suffers from a problem in that both of the measurement of the large current on the wafer and measurement of the small current of one chip cannot precisely be performed.

SUMMARY OF THE INVENTION

To solve the problems experienced with the conventional power-current measuring circuit for a burn-in tester, an object of the present invention is to provide a power-current measuring circuit for a burn-in tester incorporating a large-current measuring power supply circuit and a small-current measuring power supply circuit as the power supply circuit and arranged to arbitrarily switch the power supply circuit according to the number of chips, which must be measured, so as to be capable of precisely measuring both of a large current and a small current.

According to a first aspect of the present invention, here is provided a power-current measuring circuit for a burn-in tester for use when a burn-in test is performed such that predetermined power currents are, from outside, applied to a plurality of semiconductor integrated circuits formed on a wafer disposed in a constant temperature bath, the power-current measuring circuit for a burn-in tester comprising:

a large-current measuring power supply circuit for supplying power currents which are fed to all of the semiconductor integrated circuits or a plurality of the semiconductor integrated circuits on the wafer;

a small-current measuring power supply circuit for supplying a power current which is fed to at least one semiconductor integrated circuit on the wafer; and a power-source-output selection circuit which selectively switches output of the large-current measuring power supply circuit and output of the small-current measuring power supply circuit in accordance with the number of semiconductor integrated circuits which are formed on the wafer and which must be tested to supply power currents to the semiconductor integrated circuits which must be tested.

According to the first aspect of the present invention, the power-current measuring circuit for a burn-in tester for use when a burn-in test is performed such that predetermined power currents are, from outside, applied to a plurality of semiconductor integrated circuits formed on a wafer disposed in the constant temperature bath, the power-current measuring circuit for a burn-in tester comprising: the large-current measuring power supply circuit for supplying power currents which are fed to all of the semiconductor integrated circuits or a plurality of the semiconductor integrated circuits on the wafer; the small-current measuring power supply circuit for supplying a power current which is fed to at least one semiconductor integrated circuit on the wafer; and the power-source-output selection circuit which selectively switches output of the large-current measuring power supply circuit and output of the small-current measuring power supply circuit in accordance with the number of semiconductor integrated circuits which are formed on the wafer and which must be tested to supply power currents to the semiconductor integrated circuits which must be tested.

Therefore, the power current values in a wide range can be set which are required of a test for measuring a large current corresponding to the number of the semiconductor integrated circuits, which are formed on the wafer and which must be tested, and a test for measuring a small current can precisely be set by selecting the output of the power supply circuit by operating the measurement output selection circuit.

According to a second aspect of the present invention, there is provided a power-current measuring circuit according to the first aspect of the present invention, further comprising:

a large-current measuring circuit for measuring the power current output from the large-current measuring power supply circuit, and a small-current measuring circuit for measuring the power current output from the small-current measuring power supply circuit.

According to the second aspect of the present invention, there is provided a power-current measuring circuit further comprising: a large-current measuring circuit for measuring the power current output from the large-current measuring power supply circuit, and a small-current measuring circuit for measuring the power current output from the small-current measuring power supply circuit.

The power-current measuring circuit corresponding to the output of the power supply circuit selected by the measurement output selection circuit is provided for the power-current measuring circuit. Therefore, a required measurement resolution accuracy can be maintained when the power current output from the power supply circuit is measured.

According to a third aspect of the present invention, there is provided a power-current measuring circuit wherein a power-current detection device is provided for each of an output stage of the large-current measuring power supply circuit and an output stage of the small-current measuring power supply circuit, and the small-current measuring circuit measures the power current detected by the power-current detection device provided for the output stage of the small-current measuring power supply circuit.

According to the third aspect of the present invention, there is provided the power-current measuring circuit wherein the power-current detection device is provided for each of the output stage of the large-current measuring power supply circuit and the output stage of the small-current measuring power supply circuit, the large-current measuring circuit measures the power current detected by the power-current detection device provided for the output stage of the large-current measuring power supply circuit, and the small-current measuring circuit measures the power current detected by the power-current detection device provided for the output stage of the small-current measuring power supply circuit.

Therefore, the power-current measuring circuit according to the second aspect has the structure that the power-current detection device is provided for each output stage of the power supply circuit so that the measurement resolution accuracy for measuring the power current is improved.

According to a fourth of the present invention, there is provided a power-current measuring circuit further comprising:

a measurement output selection circuit which selectively switches the large-current measuring circuit and the small-current measuring circuit in accordance with a state of selection of each of the power current circuit performed by the power-source-output selection circuit; and a conversion circuit for converting each power current measurement signal selectively output from the measurement output selection circuit into a measured power current value so as to output the measured power current value.

According to a fourth aspect of the present invention, the power-current measuring circuit further comprises: the measurement output selection circuit which selectively switches the large-current measuring circuit and the small-current measuring circuit in accordance with a state of selection of each of the power current circuit performed by the power-source-output selection circuit, and the conversion circuit for converting each power current measurement signal selectively output from the measurement output selection circuit into a measured power current value so as to output the measured power current value.

Therefore, the large-current signal or the small-current signal which is the output of the current measuring circuit can be selected by the measurement output selection circuit and input to one conversion circuit. Therefore, a necessity for connecting the conversion circuit and its peripheral circuits to each of the current measuring circuit can be eliminated. As a result, the size of the circuit can be reduced.

As a result, reduction in the manufacturing cost of the apparatus and saving of the space are permitted and the reliability of the apparatus can be improved.

According to a fifth aspect of the present invention, there is provided a power-current measuring circuit further comprising:

control means for controlling a state where the measurement output selection circuit is selected and a state where the measurement output selection circuit is selected in accordance with the number of the semiconductor integrated circuits which are formed on the wafer and which must be tested.

According to the fifth aspect of the present invention, there is provided a power current measuring circuit further comprising: control means for controlling a state where the measurement output selection circuit is selected and a state where the measurement output selection circuit is selected in accordance with the number of the semiconductor integrated circuits which are formed on the wafer and which must be tested.

Therefore, a control program stored in the control unit enables control of the output of the power supply circuit and selection of the current measuring circuit to easily be realized in accordance with a variety of test patterns for the semiconductor integrated circuits which are formed on the wafer and which must be tested.

DETAILED DESCRIPTION OF THE PRESENT INVENTION

An embodiment of the present invention will now be described with reference to a drawing.

Figure 1:
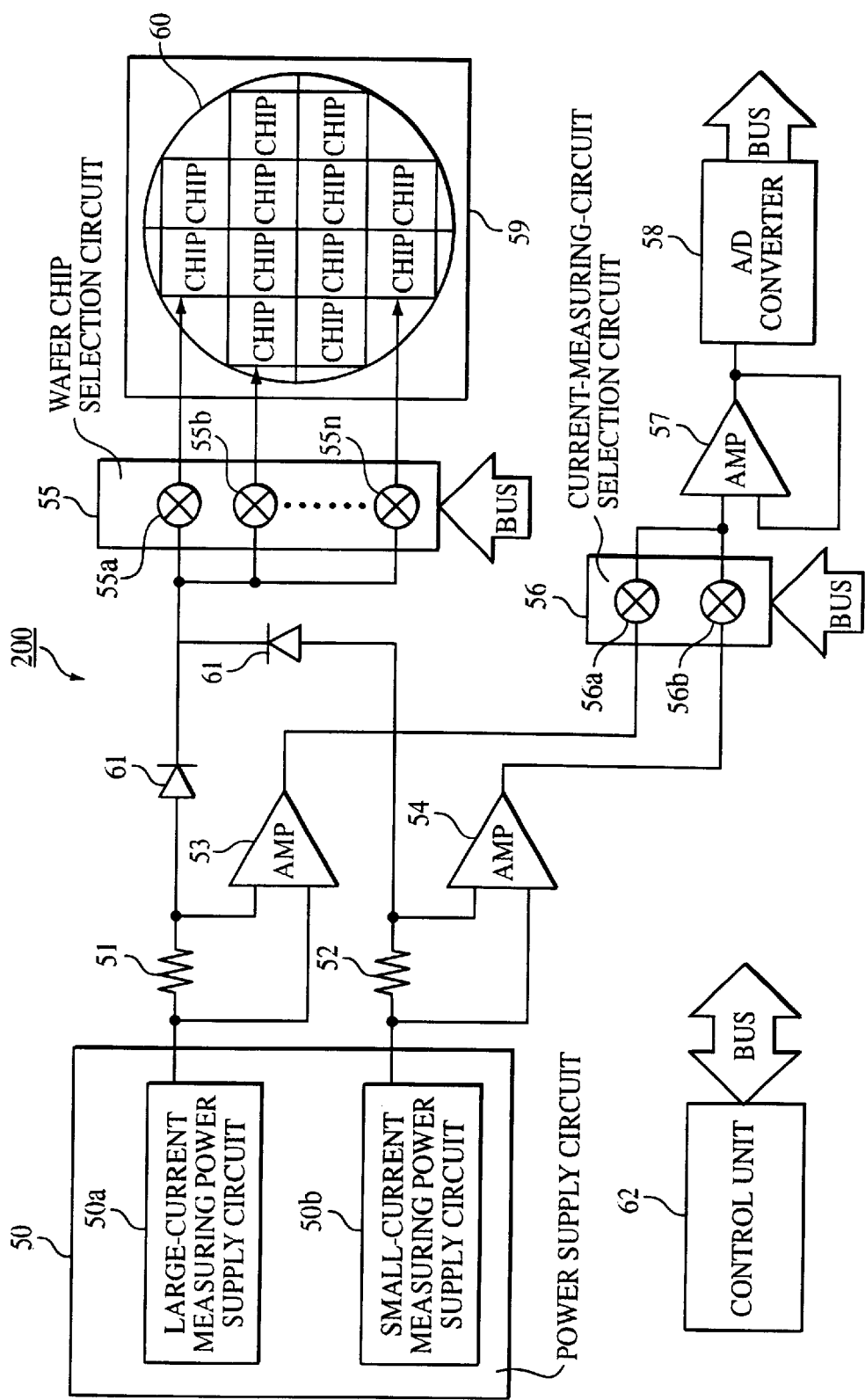
FIG. 1 is a diagram showing a structure of a power-current measuring circuit 200 according to an embodiment for a wafer level burn-in test.
Figure 2:
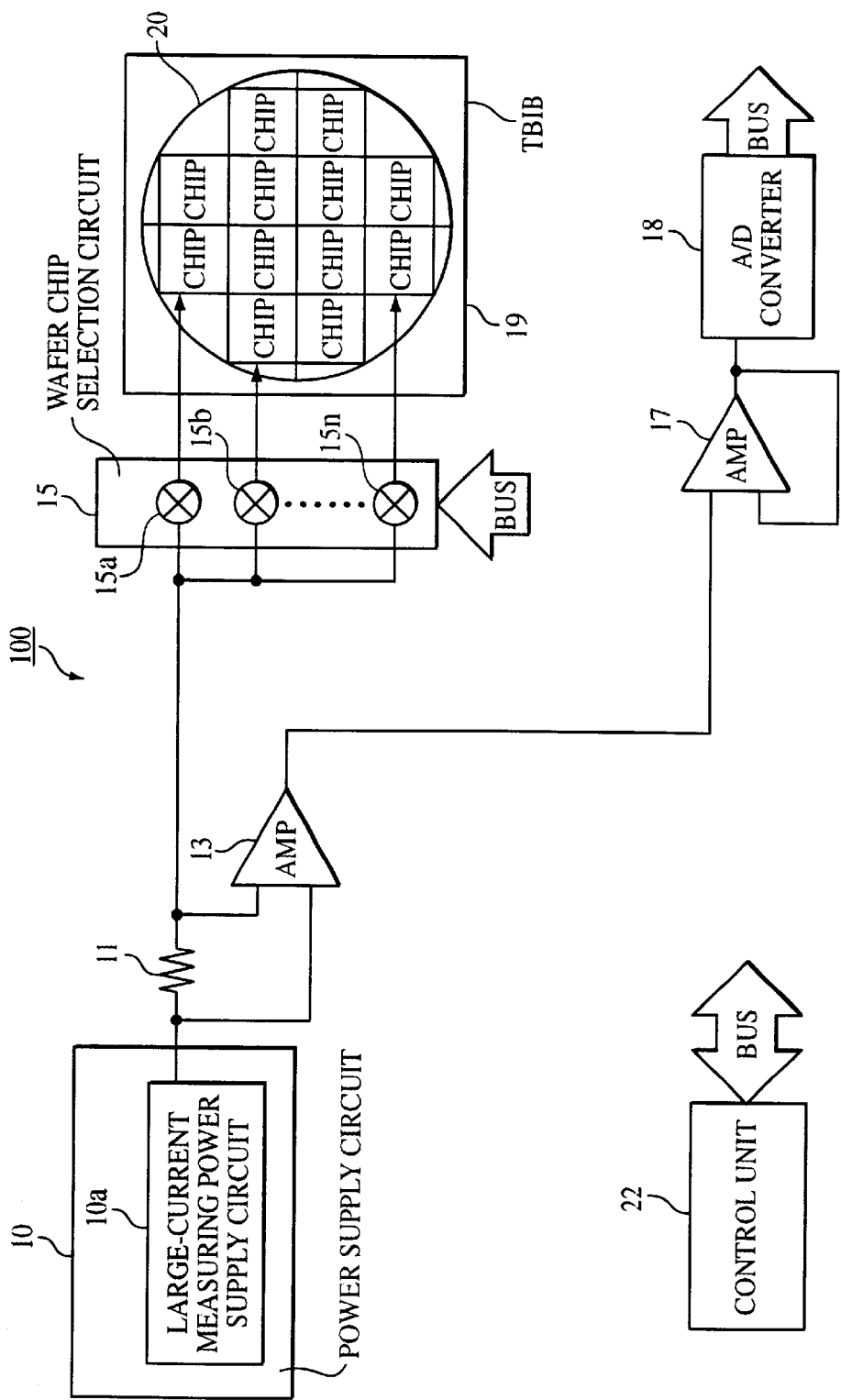
FIG. 2 is a diagram showing a structure of a conventional power-current measuring circuit 100 for a wafer level burn-in test.

FIG. 1 is a diagram showing a power-current measuring circuit 200 according to the present invention for a wafer-level burn-in tester.

Initially, the structure will now be described.

FIG. 1 is a circuit diagram of the power-current measuring circuit 200 according to this embodiment.

As shown in FIG. 1, the power-current measuring circuit 200 incorporates a power supply circuit 50, a large-current detection resistor 51, a small-current detection resistor 52, a large-current measuring circuit 53, a small-current measuring circuit 54, a wafer chip selection circuit 55, a current-measuring-circuit selection circuit 56, an AMP 57, an A/D converter 58, a reversed-current preventing circuit 61 and a control unit 62.

The power supply circuit 50 incorporates a large-current measuring power supply circuit 50a and a small-current measuring power supply circuit 50b. A large-current signal output from the large-current measuring power supply circuit 50a is, through the large-current detection resistor 51 and the reversed-current preventing circuit 61, supplied to chips on the wafer 60 selected by the wafer chip selection circuit 55. A small-current signal output from the small-current measuring power supply circuit 50b is, through the small-current detection resistor 52 and the reversed-current preventing circuit 61, supplied to a chip on the wafer 60 selected by the wafer chip selection circuit 55.

The large-current measuring circuit (AMP) 53 has an input stage connected the two ends of the large-current detection resistor 51. In response to the large-current signal output from the large-current measuring power supply circuit 50a, the large-current measuring circuit (AMP) 53 detects the differential voltage generated at the two ends of the large-current detection resistor 51. Then, the large-current measuring circuit (AMP) 53 outputs a large-current signal corresponding to the differential voltage to the AMP 57 through the current-measuring-circuit selection circuit 56.

The small-current measuring circuit (AMP) 54 has an input stage connected to the two ends of the small-current detection resistor 52. In response to the small-current signal output from the small-current measuring power supply circuit 50b, the small-current measuring circuit (AMP) 54 detects the differential voltage generated at the two ends of the small-current detection resistor 52. Then, the small-current measuring circuit (AMP) 54 outputs a small-current signal corresponding to the differential voltage to the AMP 57 through the current-measuring-circuit selection circuit 56.

The wafer chip selection circuit 55 selects a chip on the wafer 60 instructed in response to a wafer-chip selection signal input from the control unit 62 connected to the wafer chip selection circuit 55 through the bus, the selection being performed by wafer-chip selection switches 55a to 55n accommodated in the wafer chip selection circuit 55. Then, the output of the power supply circuit 50 is supplied to the selected chip.

The current-measuring-circuit selection circuit 56 selects a current measuring circuit instructed in response to a current-measuring-circuit selection signal input from the control unit 62 connected to the current-measuring-circuit selection circuit 56 through the bus, the selection being performed by a current-measuring-circuit selection switch 56a or 56b accommodated in the current-measuring-circuit selection circuit 56. Then, a measured-current signal supplied from large-current measuring circuit (AMP) 53 or the small-current measuring circuit (AMP) 54 is output to the A/D converter 58 through the AMP 57.

The A/D converter 58 converts a measured-large-current signal or a small-current-signal amplified by the A/D converter 58 from the analog form to the digital form which indicates each of measured current values. Then, the A/D converter 58 transmits the digital signal to the control unit 62 connected to the A/D converter 58 through the bus.

The reversed-current preventing circuit 61 is a protective circuit incorporating a PN-junction diode which is connected to the power supply circuit 50 in a forward direction and the chips on the wafer 60 in the reverse direction so as to prevent a reversed current from the chip. Thus, the reversed-current preventing circuit 61 protects the large-current measuring power supply circuit 50a, the small-current measuring power supply circuit 50b, the large-current measuring circuit 53 and the small-current measuring circuit 54 from damage.

The control unit 62 outputs a wafer-chip selection signal to the wafer chip selection circuit 55 connected to the control unit 62 through the bus to select the chips to which the output from the power supply circuit 50 is supplied. Similarly, the control unit 62 outputs a current-measuring-circuit selection signal to the current-measuring-circuit selection circuit 56 connected to the control unit 62 through the bus to select a current measuring circuit. Moreover, the control unit 62 analyzes the digital signal transmitted from the A/D converter 58 through the bus to calculate the measured current value.

The operation of this embodiment will now be described.

The power-current measuring circuit 200 incorporates the power supply circuit 50 which includes the large-current measuring power supply circuit 50a and the small-current measuring power supply circuit 50b having different capacities. Therefore, a power supply circuit can be selected in accordance with the number of chips on the wafer 60 which must be measured.

When the power current of all chips or a plurality of chips on the wafer 60 is measured, the large-current measuring power supply circuit 50a having a large capacity is selected and turned on. The output from the large-current measuring power supply circuit 50a is, through the large-current detection resistor 51 and the reversed-current preventing circuit 61, supplied to all of the chips or the plural chips selected by the wafer chip selection circuit 55. The output from the large-current measuring power supply circuit 50a is as well as supplied to the large-current measuring circuit (AMP) 53 having the input stage connected to the two ends of the large-current detection resistor 51. The large-current measuring circuit (AMP) 53 detects the differential voltage generated at the two ends of the large-current detection resistor 51 to output a measured large-current signal corresponding to the detected differential voltage to the A/D converter 58 through the current-measuring-circuit selection circuit 56 and the AMP 57. The digital signal indicating the measured current value converted by the A/D converter 58 is transmitted to the control unit 62 through the bus. Thus, the large current value can be measured.

When the power current of one chip on the wafer 60 is measured, the small-current measuring power supply circuit 50b is selected and turned on. The output of the small-current measuring power supply circuit 50b is, through the small-current detection resistor 52 and the reversed-current preventing circuit 61, supplied to the chip selected by the wafer chip selection circuit 55. The output of the small-current measuring power supply circuit 50b is as well as supplied to the small-current measuring circuit (AMP) 54 having the input stage connected to the two ends of the small-current detection resistor 52. The small-current measuring circuit (AMP) 54 detects the differential voltage generated at the two ends of the small-current detection resistor 52 to output a measured small-current signal corresponding to the detected differential voltage to the A/D converter 58 through the current-measuring-circuit selection circuit 56 and the AMP 57. The digital signal converted by the A/D converter 58 and indicating the measured current value is, through the bus, transmitted to the control unit 62. Thus, the small current value can be measured.

The power-current measuring circuit 200 according to this embodiment is structured such that the large-current measuring power supply circuit 50a or the small-current measuring power supply circuit 50b is selected in accordance with the number of chips which must be measured. Thus, setting of power current in a wide range which is required of both of the test of the large current and that of the small current can precisely be performed.

Since the large-current measuring circuit 53 or the small-current measuring circuit 54 corresponding to the power supply circuit is provided, a required resolution accuracy for measuring the power current of the selected power supply circuit can be maintained.

Since the current-measuring-circuit selection circuit 56 is employed, selection of a large current signal or a small current signal and input of the selected signal to one A/D converter 58 can be performed. Therefore, a necessity for connecting the conversion circuit and its peripheral circuits to each of the current measuring circuit can be eliminated. As a result, the reduction in the size enables the cost required to manufacture the apparatus to be reduced and the space to be saved. As a result, the reliability of the apparatus can be improved.

The power-current measuring circuit according to the first aspect of the present invention enables the power current values in a wide range can be set which are required of a test for measuring a large current corresponding to the number of the semiconductor integrated circuits, which are formed on the wafer and which must be tested, and a test for measuring a small current to precisely be set by selecting the output of the power supply circuit by operating the measurement output selection circuit.

The power-current measuring circuit according to the second aspect of the present invention has the structure that the power-current measuring circuit corresponding to the output of the power supply circuit selected by the measurement output selection circuit is provided for the power-current measuring circuit. Therefore, a required measurement resolution accuracy can be maintained when the power current output from the power supply circuit is measured.

The power-current measuring circuit according to the third aspect of the present invention has a structure of the power-current measuring circuit, wherein the power-current detection device is provided for each output stage of the power supply circuit so that the measurement resolution accuracy for measuring the power current is improved.

The power-current measuring circuit according to the fourth aspect of the present invention has a structure of the power-current measuring circuit. Therefore, the large-current signal or the small-current signal which is the output of the current measuring circuit can be selected by the measurement output selection circuit and input to one conversion circuit. Therefore, a necessity for connecting the conversion circuit and its peripheral circuits to each of the current measuring circuit can be eliminated. As a result, the size of the circuit can be reduced.

As a result, reduction in the manufacturing cost of the apparatus and saving of the space are permitted and the reliability of the apparatus can be improved.

The power-current measuring circuit according to the fifth aspect of the present invention has a structure of the power-current measuring circuit. Therefore, a control program stored in the control unit enables control of the output of the power supply circuit and selection of the current measuring circuit to easily be realized in accordance with a variety of test patterns for the semiconductor integrated circuits which are formed on the wafer and which must be tested.

What is claimed is:

1. A power-current measuring circuit for a burn-in test in which a power current is supplied semiconductor integrated circuits on a wafer disposed in a constant temperature bath, the power-current measuring circuit comprising:

a large-current measuring power supply circuit for supplying a first power current to at least one of the semiconductor integrated circuits;

a small-current measuring power supply circuit for supplying a second power current to at least one of the semiconductor integrated circuits;

a power-source-output selection circuit for selectively switching an output of the large-current measuring power supply circuit and an output of the small-current measuring power supply circuit in accordance with how many semiconductor integrated circuits are to be tested, and the power-source-output selection circuit for supplying the first or second power current to the semiconductor integrated circuits to be tested;

a first power-current detection device connected to an output stage of the large-current measuring power supply circuit, the first power-current detection device for detecting the first power current;

a second power-current detection device connected to an output stage of the small-current measuring power supply circuit, the second power-current detection device for detecting the second power current;

a large-current measuring circuit for measuring the first power current detected by the first power-current detection device; and a small-current measuring circuit for measuring the second power current detected by the second power-current detection device.

2. The power-current measuring circuit according to claim 1 wherein the large-current measuring circuit is for measuring the first power current outputted from the large-current measuring power supply circuit, and the small-current measuring circuit is for measuring the power current output from the small-current measuring power supply circuit.

3. The power-current measuring circuit according to claim 1 comprising:

a measurement output selection circuit for selectively switching the large-current measuring circuit and the small-current measuring circuit in accordance with a state of the selection of the large-current measuring power supply and the small-current measuring power supply circuit selected by the power-source-output selection circuit; and a conversion circuit for converting a power current measurement signal selectively outputted from the measurement output selection circuit into a measured power current value to output the measured power current value.

4. The power-current measuring circuit according to claim 1 comprising:

a controller for controlling a state where the measurement output selection circuit is selected in accordance with how many semiconductor integrated circuits are to be tested.

5. The power-current measuring circuit according to claim 1, wherein the large-current measuring power supply circuit outputs the first power current larger than the second power current outputted from the small-current measuring power supply circuit.

* * * * *